US006876319B2

(12) United States Patent
Webster et al.

(10) Patent No.: US 6,876,319 B2
(45) Date of Patent: Apr. 5, 2005

(54) INTEGRATED MODULATOR AND DEMODULATOR CONFIGURATION

(75) Inventors: Mark A. Webster, Indian Harbour Beach, FL (US); Kent A. Ponton, Palm Bay, FL (US); Paul J. Chiuchiolo, Jr., Melbourne, FL (US)

(73) Assignee: Intersil Americas Inc., Irvine, CA (US)

( * ) Notice: Subject to any disclaimer, the term of this patent is extended or adjusted under 35 U.S.C. 154(b) by 31 days.

(21) Appl. No.: 10/306,020

(22) Filed: Nov. 27, 2002

(65) Prior Publication Data

US 2004/0056785 A1 Mar. 25, 2004

Related U.S. Application Data

(60) Provisional application No. 60/412,334, filed on Sep. 20, 2002.

(51) Int. Cl.[7] ................................................ H03M 3/00
(52) U.S. Cl. ......................................... 341/143; 341/61
(58) Field of Search ................................. 341/144, 155, 341/143, 61; 375/324

(56) References Cited

U.S. PATENT DOCUMENTS

| | | | | |
|---|---|---|---|---|
| 4,726,069 A | | 2/1988 | Stevenson | 455/46 |
| 4,902,979 A | * | 2/1990 | Puckette, IV | 329/343 |
| 5,274,372 A | * | 12/1993 | Luthra et al. | 341/61 |
| 5,482,044 A | * | 1/1996 | Lin et al. | 600/453 |
| 5,587,939 A | * | 12/1996 | Soleymani et al. | 708/319 |
| 5,640,416 A | * | 6/1997 | Chalmers | 375/147 |
| 5,694,419 A | * | 12/1997 | Lawrence et al. | 375/222 |
| 5,907,585 A | * | 5/1999 | Suzuki et al. | 375/324 |
| 5,926,783 A | * | 7/1999 | Goeckler | 702/190 |
| 6,067,329 A | * | 5/2000 | Kato et al. | 375/321 |
| 6,141,372 A | * | 10/2000 | Chalmers | 375/147 |
| 6,236,847 B1 | * | 5/2001 | Stikvoort | 455/313 |

FOREIGN PATENT DOCUMENTS

WO   WO 00 45503 A   8/2000

WO   PCT/US03/0128068   *   7/2003 ................. 327/522

OTHER PUBLICATIONS

Gurcan M K et al., "A Digital Single Sideband Modulator" 1988 IEEE International Symposium on Circuits and Systems. Proceedings (CAT. No. 88CH2458–8), Espoo, Finland, vol. 2, Jun. 7–9, 1988, pp. 1811–1814, XP010069264 New York, NY USA.

Pellon L E: "A Double Nyquist Digital Product Detector For Quadrature Sampling" IEEE Transactions on Signal Processing, IEEE, Inc. New York, US, vol. 40, No. 7, Jul. 1, 1992 pp. 1670–1680, XP000307658.

Lagedec R: "Digital Channel Translators Based on Quadrature Processing (SSB)" Mitteilungen Agen, Nov. 1975, Switzerland, No. 19, pp. 3–35, XP008028094; ISSN: 0378-1291.

PCT Notification of Transmittal of the International Search Report or the Declaration, dated Mar. 9, 2004, 5 pages.

* cited by examiner

*Primary Examiner*—Peguy JeanPierre
(74) *Attorney, Agent, or Firm*—Hunton & Williams LLP

(57) ABSTRACT

An integrated demodulator and decimator circuit including a selective digital sign inverter and a decimator. The sign inverter negates selected digital samples based on Weaver demodulation and outputs demodulated digital samples at a sample rate. The decimator is a symmetric half-band FIR filter, where the demodulated digital samples are sequentially shifted through filter taps at the sample rate. The decimator outputs real output values based on digital samples shifted into alternate taps and imaginary output values based on digital samples shifted into the center tap. An integrated modulator and interpolator circuit includes a symmetric half-band FIR filter interpolator and a digital sign inverter. The interpolator includes two polyphase filters and a multiplexer. A first polyphase filter filters real digital samples and a second filters imaginary digital samples. The multiplexer provides interpolated digital samples at four times the sample rate. The digital sign inverter negates selected digital samples according to Weaver modulation.

25 Claims, 9 Drawing Sheets

INTEGRATED MODULATOR AND DEMODULATOR CONFIGURATION

CROSS-REFERENCE TO RELATED APPLICATION(S)

The present application is based on U.S. Provisional Patent Application entitled "Weaver Modulator And Demodulator Implementation", Ser. No. 60/412,334, filed Sep. 20, 2002, which is hereby incorporated by reference in its entirety.

FIELD OF THE INVENTION

The present invention relates to communications, and more particularly to an integrated configuration of a modulator and demodulator in a baseband processor of a communication device, such as a wireless RF transceiver.

BACKGROUND OF THE INVENTION

Modulation is the process of encoding information onto a bandpass signal for purposes of transmission via a selected medium. Many modulation techniques are known for encoding data, including single-carrier and multi-carrier methods, where the particular method chosen depends upon the application and, the selected medium of transmission. One such multi-carrier method used for wireless communications is orthogonal frequency division multiplexing (OFDM). For example, the Institute of Electrical and Electronics Engineers, Inc. (IEEE) 802.11a standard defines multiple data rates in the 5 Gigahertz (GHz) frequency band employing orthogonal frequency division multiplexing (OFDM) for use with Wireless Local Area Networks (WLANs). OFDM is an encoding process performed in a transmitter in which data is mapped onto multiple subcarriers, which are then combined into one baseband signal using Inverse Fast-Fourier Transform (IFFT). The encoded baseband signal is ultimately up-converted to the appropriate transmission radio frequency (RF), such as, for example, 5 GHz for 802.11a. The reverse process is performed at the receiver, which down-converts a received RF signal to a baseband signal and then demodulates the baseband signal to recover the original data.

The up-conversion and down-conversion process may be performed in multiple steps involving at least one intermediate frequency (IF). In one exemplary transmitter configuration, an OFDM encoded signal modulates a first carrier IF of approximately 20 megahertz (MHz), and then the modulated signal is up-converted to a second, higher IF of approximately 800 MHz, and then up-converted to the final RF of approximately 5 GHz for transmission through a wireless medium via an antenna. The initial up-conversion to the lower IF may be a modulation process in which a carrier signal is modulated by the baseband data. One such modulation process is known as Weaver modulation in which a mixer is used to combine the baseband signal with a sinusoidal signal at the desired IF resulting in a sideband signal at IF. To avoid various radio impairments, such as DC offset and flicker noise, the initial encoding and modulation process to the lower IF is typically performed digitally using a baseband processor or the like. The raw data is encoded using OFDM or the like, interpolated to increase bandwidth and sample rate and to maintain signal fidelity, and then modulated to the first IF using an appropriate scheme such as Weaver modulation. A digital to analog converter (DAC) converts the signal to an analog signal, which is then processed using additional filters and mixers to produce the appropriate RF signal for transmission. A corresponding receiver employs mixers and filters to down-convert a received RF signal to the lower IF, and an analog to digital converter (ADC) to convert the analog IF signal to digital format. The IF signal is then digitally demodulated to a baseband signal, and one or more decimators reduce the sample rate to the appropriate level for further baseband processing to retrieve the original data.

Encoding schemes such as OFDM result in complex digital data including real and imaginary digital samples in the transmitter. The interpolation process is performed on the complex information, which had typically required both real and imaginary circuit portions. The Weaver modulation has required a complex multiplier or the like to combine complex interpolated samples with complex phase-shift values resulting in a complex IF signal. Only after the complex IF signal is generated can the imaginary values be stripped out resulting in real-only data values. A negative-frequency mirror image is created by saving only the real part of the signal, but this undesired signal energy can be removed by analog filtering in the radio. In the receiver, real-only samples are sampled by the ADC, but were typically converted to complex samples by the Weaver demodulation process. The digital decimators, therefore, had to be implemented to process both the real and imaginary values to provide accurate data for decoding within the baseband processor. In this manner, the encoding, interpolation and modulation process as well as the demodulation and decimation process has required a significant number of components to perform the desired functions, including shift registers, complex adders, complex multipliers, etc. This has resulting in a relatively large number of gates, nets, cells and total silicon area to implement a baseband processor in silicon. The additional number of components and resulting large size of the circuitry had further resulted in significant power consumption.

It is desired to provide more efficient modulation and demodulation solutions, such as by simplifying or otherwise reducing circuitry and resulting power consumption.

SUMMARY OF THE INVENTION

An integrated demodulator and decimator circuit and an integrated modulator and interpolator circuit according to embodiments of the present invention significantly reduce circuit area, cost and power consumption. The integrated demodulator and decimator circuit processes digital samples of a received signal having a predetermined intermediate frequency (IF) and that has been sampled at a sample rate based on a clock having a frequency that is four times the IF. The integrated demodulator and decimator circuit includes a selective digital sign inverter and a decimator. The selective digital sign inverter sign inverts the sign of selected digital samples according to a predetermined phase-shift pattern and outputs demodulated digital samples at the sample rate. The decimator is provided in the form of a FIR filter with a plurality of taps, where the demodulated digital samples are sequentially shifted through the filter taps at the sample rate. The decimator outputs complex digital values at half of the sample rate, where the complex digital values are derived from taps whose outputs are always either real or imaginary only. In a specific embodiment, the decimator is a symmetric half-band FIR filter with alternating zero and non-zero taps including a center tap. The complex output includes real output values based on demodulated digital samples shifted into alternate taps and corresponding imaginary output values based on demodulated digital samples shifted into the center tap.

An integrated modulator and interpolator circuit according to an embodiment of the present invention modulates a carrier signal having a predetermined IF with a baseband signal which has been sampled at a sample rate having approximately the same frequency as the IF and which has been interpolated into complex digital samples at twice the sample rate. The integrated modulator and interpolator circuit includes a FIR filter interpolator and a digital sign inverter. The interpolator includes first and second polyphase filters and a multiplexer. The first polyphase filter includes alternate taps of the filter for receiving and filtering real digital samples of the complex digital samples at the first sample rate. The second polyphase filter includes the remaining taps of the filter for receiving and filtering imaginary digital samples of the complex digital samples at the sample rate. The multiplexer is coupled to the outputs of the polyphase filters for providing interpolated digital samples at four times the sample rate. The digital sign inverter negates selected digital samples of the interpolated digital samples according to a predetermined phase-shift pattern and outputs modulated digital samples of a modulated signal at IF. In a specific embodiment, the interpolator is a symmetric half-band FIR filter.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF EMBODIMENT(S) OF THE INVENTION

Figure 1:
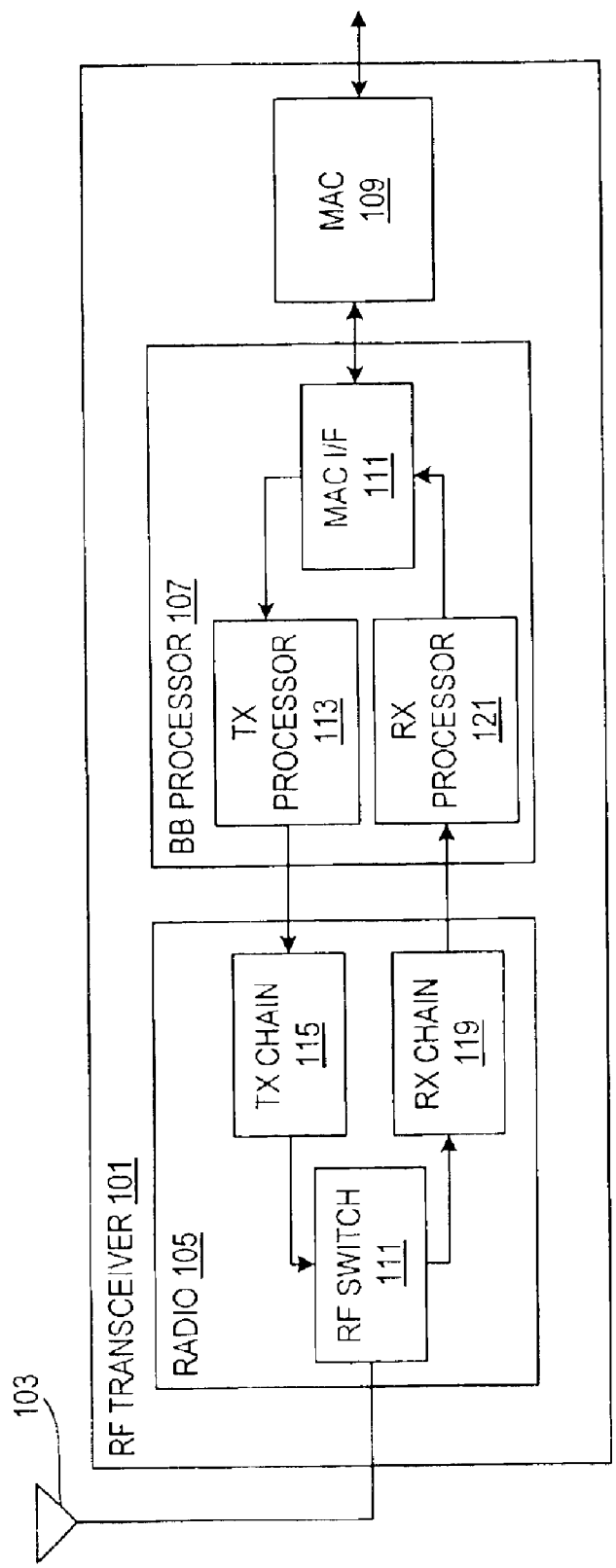
FIG. 1 is a block diagram of a wireless radio frequency (RF) transceiver implemented according to an embodiment of the present invention.

FIG. 1 is a block diagram of a wireless radio frequency (RF) transceiver 101 implemented according to an embodiment of the present invention. The transceiver 101 may be used to communicate with one or more similar wireless devices across a wireless medium, such as within a wireless local area network (WLAN) or the like. Although the present invention is illustrated for use in a WLAN device in exemplary embodiments, it is understood that the present invention is not limited to WLAN applications or even wireless applications but instead applies to any wired or wireless communication device employing modulation and demodulation functions. The transceiver 101 may be used by any type of device to incorporate wireless communication capabilities, such as a wireless access point (AP), any type of computer or computer system (e.g., personal computers, laptop computers, desktop computers, etc.,), printing devices including any type of printer technology, personal digital assistants (PDAs) or the like, scanners, fax machines, etc.

The transceiver 101 may be configured as a plug-in peripheral or expansion card that plugs into an appropriate slot or interface of a computer system, such as a Personal Computer Memory Card International Association (PCMCIA) card or PC Card or may be implemented according to any type of expansion or peripheral standard, such as according to the peripheral component interconnect (PCI), the Industry Standard Architecture (ISA), the Extended-ISA (EISA) standard, etc. Mini PCI cards with antennas embedded in displays are also contemplated. Self-contained or standalone packaging with appropriate communication interface(s) is also contemplated, which is particularly advantageous for APs. The transceiver 101 may be implemented as a separate unit with serial or parallel connections, such as a Universal Serial Bus (USB) connection or an Ethernet interface (twisted-pair, coaxial cable, etc.), or any other suitable interface to the device. Other types of wireless devices are contemplated, such as any type of wireless telephony device including cellular phones.

The transceiver 101 communicates via the wireless medium using one or more antennas 103 coupled to an internal radio chip or device (radio) 105. The radio 105 generally converts between RF signals and Baseband signals and is coupled to a Baseband (BB) processor 107. Within the radio 105, an RF switch 117 selects either a transmission (TX) chain 115 for transmission or an RF chain 119 for reception of packets. The Baseband processor 107 is further coupled to a medium access control (MAC) device 109 that communicates with the associated communication device or system. Digital data sent from or received by the transceiver 101 is processed through the MAC 109. For transmission, the MAC 109 asserts digital data signals via a MAC interface (I/F) 111 to a TX processor 113, which formulates data into packets for transmission. The digital packet information is converted to analog signals using a digital to analog converter (DAC) 215 (FIG. 2) and processed by the TX chain 115 for converting the packets into RF signals suitable for transmission via the antenna 103. Although not explicitly shown, the TX chain 115 typically includes up-converters or mixers and filters to convert a baseband analog signal into an RF signal for transmission.

Figure 6:
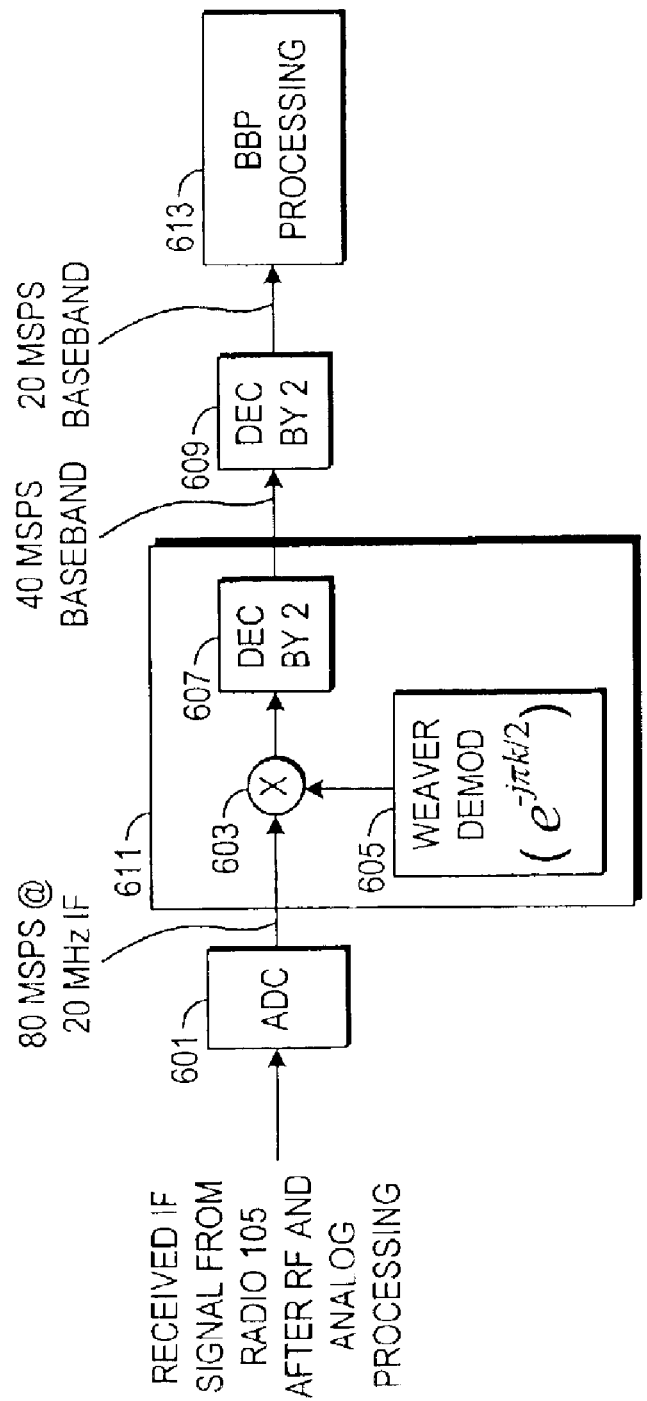
FIG. 6 is a block diagram illustrating a functional transfer function of the RX processor of FIG. 1.

For receive operations, the RX chain 119 extracts a Baseband signal from a received RF signal and provides digital Baseband signals to a receive (RX) processor 121 via an analog to digital converter (ADC) 601 (FIG. 6). Although not explicitly shown, the RX chain 119 typically includes down-converters or mixers and filters to perform the conversion process to the baseband analog signal. The RX processor 121 generally performs the inverse functions of the TX processor 113 to extract data from received packets into data signals for the associated communication device. The data is forwarded to the MAC 109 via the MAC I/F 111 as shown. Other functions are not shown, such as automatic gain control (AGC) functions and power control functions and the like for amplifying or attenuating the received signal to a desired target power level.

The transceiver 101 may be implemented according to the Institute of Electrical and Electronics Engineers, Inc. (IEEE) 802.11a standard operating at approximately 5 Gigahertz (GHz) for use with a WLAN. The IEEE 802.11a standard defines data rates of 6, 9, 12, 18, 24, 36, 48 and 54 megabits per second (Mbps) in the 5 GHz band employing orthogonal frequency division multiplexing (OFDM). OFDM is a multi-carrier modulation technique in which data is carried on a plurality of "tones" or "sub-carriers" associated with a multi-carrier signal. In the OFDM embodiment, communication is established using packets of information including a one or more synchronization data fields followed by a plurality of OFDM symbols. In an OFDM configuration, 52 sub-carrier signals are incorporated within each OFDM symbol, including 48 data tones and 4 pilot tones as known to those skilled in the art. Data is incorporated on each data tone using a selected modulation scheme, such as binary phase shift keying (BPSK), Quadrature PSK (QPSK), 16 Quadrature Amplitude Modulation (QAM), and 64 QAM. Each of the modulation schemes employs a corresponding constellation with two, four, 16 or 64 constellation points, respectively. The data rate is determined by the modulation scheme used for data. For example, BPSK is used for 6 or 9 Mbps, QPSK is used for 12 or 18 Mbps, 16 QAM is used for 24 or 36 Mbps, and 64 QAM is used for 48 or 54 Mbps. It is appreciated, however, that the teachings of the present invention may be applied in the same or similar manner to other types of wired or wireless communications including wireless devices using any particular RF band. For example, the present invention is applicable to Wi-Fi systems at 2.4 GHz operating according to IEEE 802.11b.

Figure 2:
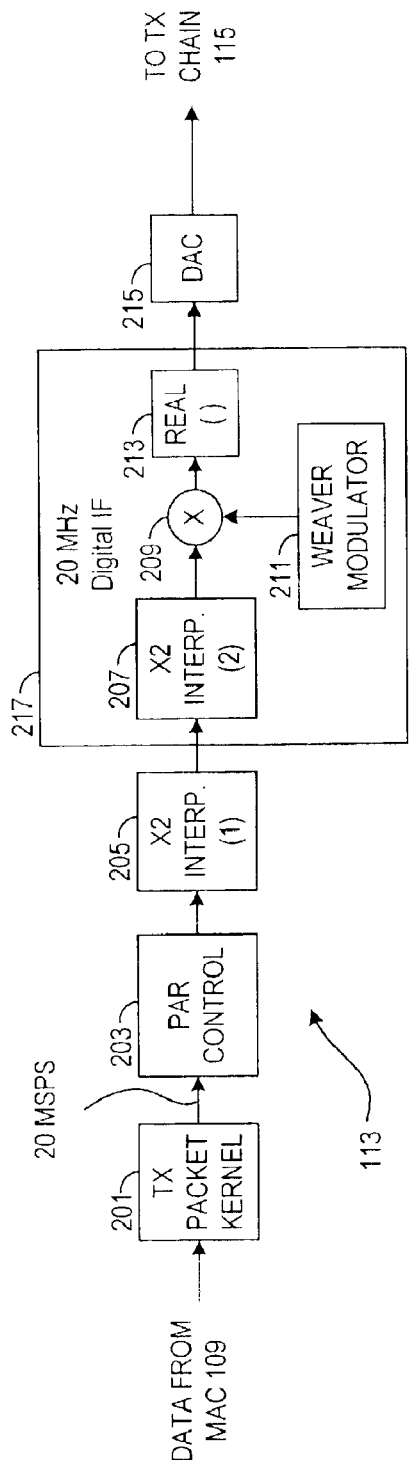
FIG. 2 is a simplified block diagram of illustrating a functional transfer function of the TX processor of FIG. 1.

FIG. 2 is a simplified block diagram of illustrating a functional transfer function of the TX processor 113. Data to be transmitted is provided to a TX packet kernel 201 of the TX processor 113 from the MAC 109. The TX packet kernel 201 is a transmitter processor that converts the "raw" digital data from an underlying device into OFDM samples at a rate of 20 mega samples per second (Msps) in accordance with the IEEE 802.11a standard as known to those skilled in the art. The OFDM information from the TX packet kernel 201 is provided to a Peak to Average Ratio (PAR) control circuit 203, which controls power output of the samples from the TX packet kernel 201. The output sample stream from the PAR control circuit 203 is provided to a first interpolator 205 and then to a second interpolator 207, where each interpolator 205, 207 doubles the number of samples in the embodiment shown. In this manner, the first interpolator 205 receives samples at a rate of 20 Msps and provides samples at a rate of 40 Msps and the second interpolator 207 receives the 40 Msps samples and generates samples at a rate of 80 Msps.

It is noted that the sample rate in Msps generally corresponds with the clock frequency in megahertz (MHz) in the configurations described herein. In the illustrated embodiments, a primary clock signal has a frequency of approximately 80 MHz and is used by various components, including the DAC 215 and the ADC 601, to handle sample rates of up to 80 Msps including 20 Msps and 40 Msps. As described further below, the baseband signal at the output of the TX packet kernel 201 modulates to a 20 MHz intermediate frequency (IF) carrier signal for further processing by the TX chain 115 of the radio 105. The 20 MHz carrier signal is modulated by the baseband signal and centered at 20 MHz IF giving a maximum frequency of 30 MHz. The Nyquist rate is ideally 60 MHz. The rate of 80 MHz is used for convenience and for practical purposes since real filters are being used and since the number 80 has the unique property of convenient conversion using interpolation (up-shifting) by 4 and decimation (down-shifting) by 4 for the transmitter and receiver, respectively. The use of a pair of ×2 interpolators in the transmitter and a pair of ÷2 decimators in the receiver provides a convenient and appropriate conversion.

The output digital samples of the second interpolator 207 are provided at a rate of 80 Msps to an input of a digital mixer 209, which combines the digital samples from the interpolator 207 with phase values generated by a Weaver modulator 211 received at another input. The mixer 209 and the Weaver modulator 211 collectively perform Weaver modulation. The digital samples from the second interpolator 207 and the information from the Weaver modulator 211 could be provided in complex format including real and imaginary values. If so, the mixer 209 would be implemented as a digital complex multiplier to accurately combine the complex information and to provide modulated information in the form of complex digital outputs. The information from the Weaver modulator 211 is a carrier signal in the form of phase-shift values at a predetermined IF, such as 20 MHz in the embodiment shown, that is modulated by the digital sample stream. The output of the mixer 209 is coupled to the input of a REAL( ) block 213, which performs the "REAL( )" function by removing imaginary values from the complex digital values. The REAL( ) block 213 provides the resulting real values to the DAC 215. In the embodiment shown, the DAC 215 is an 8-bit, 80 MHz DAC that provides a 20 MHz IF analog signal to the TX chain 115. The present disclosure partly concerns implementation of the second interpolator 207, the mixer 209, the Weaver modulator 211 and the REAL( ) block 213, collectively shown as circuit 217.

Figure 3:
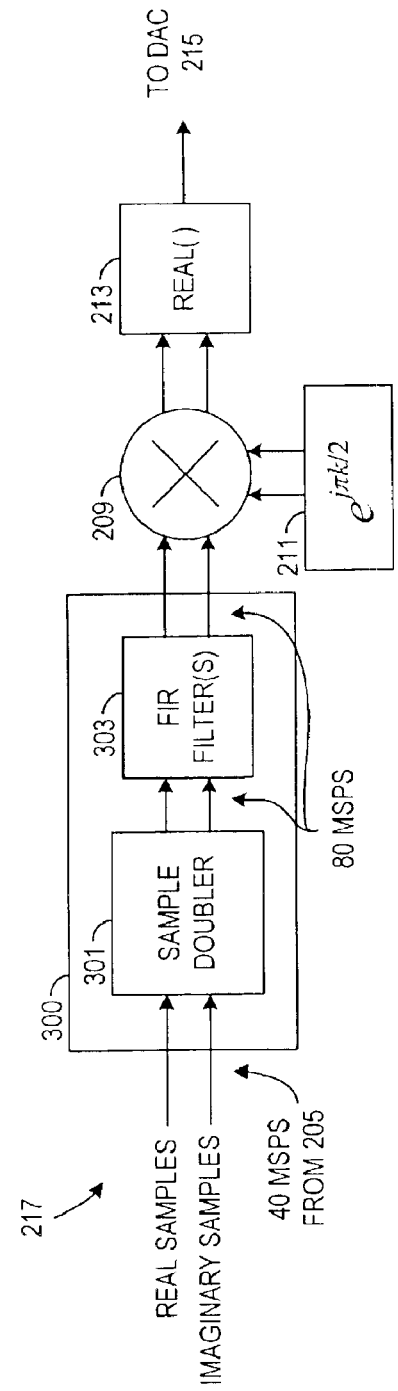
FIG. 3 is a block diagram illustrating a possible configuration of the circuit of FIG. 2.

FIG. 3 is a block diagram illustrating a possible configuration of the circuit 217. Similar components assume identical reference numbers. Real and imaginary samples from the first interpolator 203 are provided to a sample doubler 301 within an interpolator 300 implementing the second interpolator 207. The sample doubler 301 doubles the number of samples and the effective sample rate by inserting zero values between each set of real and imaginary samples. The doubled sample stream is then provided to adaptive finite impulse response (FIR) filters 303, which interpolate between actual sample values using a weighted average to fill in the zeroes. A pair of filters would be used, including one for the real samples and one for the imaginary samples. The interpolated sample values are then provided to the mixer 209, shown as a complex multiplier.

The Weaver modulator 211 provides phase-shift multipliers to the mixer 209 in the generalized form of $e^{j2\pi k f_c / f_s}$, where fc is the carrier frequency, fs is the sample rate and k is an index value of integer values starting at zero for the first sample and increasing by one for each new sample. In the embodiment shown, the carrier frequency fc=20 MHz and the sample rate, converted to equivalent frequency based on the clock signal, is fs=80 MHz. In this manner, the phase-shift multipliers from the Weaver modulator 211 take the form $e^{j\pi k/2}$. In complex format for k=0, 1, 2, . . . , the phase-shift multipliers become a repeating sequence of 1+j0, 0+j1, −1+j0, and 0−j1, resulting in a predictable repeating sequence: 1, j, −1, −j, 1, j, −1, −j, . . . . It is noted that multiplication of phase in the time domain is equivalent to shifting of the frequency in the frequency domain. The Weaver modulator 211 delivers the repeating phase values for corresponding samples and the mixer 209 effectively shifts the baseband signal to the 20 MHz IF. The modulated output values from the mixer 209 are provided to the REAL( ) block 213, which strips off the imaginary values and outputs the real values to the DAC 215.

Figure 4:
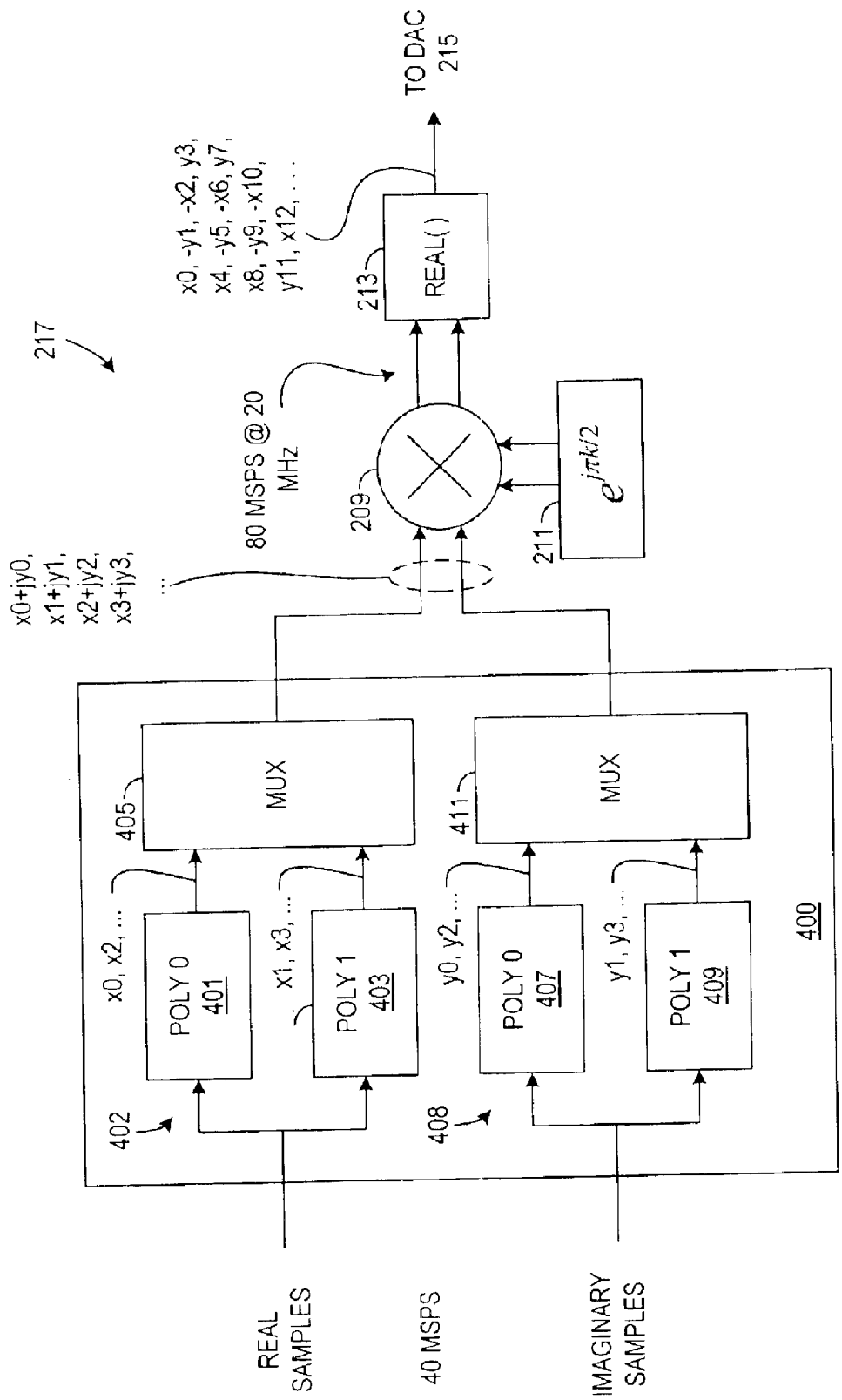
FIG. 4 is another block diagram illustrating an embodiment of the circuit of FIG. 2 showing an equivalent implementation of the interpolator of FIG. 3.

FIG. 4 is another block diagram illustrating an embodiment of the circuit 217 showing an equivalent implementation of the interpolator 300, shown as interpolator 400. Again, similar components assume identical reference numbers. The interpolator 400 includes a pair of symmetric half-band FIR filters 402 and 408, where each FIR filter 402 and 408 is further divided into a pair of polyphase filters 401, 403 and 407, 409, respectively. The real values are provided to the inputs of the polyphase filters 401 and 403 of the FIR filter 402 and the imaginary values are provided to the inputs of the polyphase filters 407 and 409 of the FIR filter 408. A first multiplexer (MUX) 405 has selectable inputs coupled to respective outputs of the polyphase filters 401 and 403 and a second MUX 411 has selectable inputs coupled to respective outputs of the polyphase filters 407 and 409. An output of the MUX 405 is provided to one input of the mixer 209 and an output of the MUX 411 is provided to another input of the mixer 209. In this case, the mixer 209 is implemented as a digital complex multiplier which multiplies complex phase-shift values from the Weaver modulator 211 with complex values from the interpolator 400 and provides complex outputs to the input of the REAL( ) block 213.

The polyphase filters 401 and 403 each include every other tap of the symmetric half-band FIR filter 402 for processing the real values and the polyphase filters 407 and 409 each include every other tap of the symmetric half-band FIR filter 408 for processing the imaginary values. In one embodiment, the polyphase filters 401 and 407 each nonzero coefficient taps and the polyphase filters 403 and 409 each include zero coefficient taps on either side of a center tap. In one embodiment, the center tap for each FIR filter 402 and 408 is unity and the non-zero coefficients are programmed to perform a predetermined low pass filter (LPF) function. For each complex value provided at the inputs of the FIR filter 402 and 408, the MUXs 405 and 411 select a first complex pair of outputs from the polyphase filters 401 (real) and 407 (imaginary) and a second pair of outputs from the polyphase filters 403 (real) and 409 (imaginary) so that the effective sample rate through the interpolator 400 is doubled to 80 Msps. It is appreciated that this implementation would otherwise require a pair of FIR filters, a pair of MUXs or the like, a REAL( ) functional block and a complex multiplier.

The MUX 405 alternates between the respective outputs of the polyphase filters 401 and 403 to output a stream of real values x0, x1, x2, x3, . . . , and the MUX 411 alternates between the respective outputs of the polyphase filters 407 and 409 to output a stream of imaginary values y0, y1, y2, y3, . . . . The combined result is represented as x0+jy0, x1+jy1, x2+jy2, . . . . The mixer 209 multiplies respective complex sample values by the rotating phase values 1, j, −1, −j, 1, j, −1, −j, . . . , etc. as previously described, and the REAL( ) block 213 selects only the real value outputs of the multiplied outputs resulting in the output sample stream x0, −y1, −x2, y3, x4, −y5, −x6, y7, x8, −y9, −x10, y11, x12, . . . . Several observations of the overall transfer function of the circuit 217 provides significant simplification by integration. The choice of frequency ratio of the sample rate and the IF results in a simplified discrete 90 degree counter-clockwise phase-shift multiple rotation that alternates between unity real and imaginary multiples with a predicable sign-change pattern. In particular, the rotating phase values 1, j, −1, −j, 1, j, −1, −j, . . . , etc., alternate between real and imaginary and every other pair of values are sign inverted or negated (the first pair positive, the second pair negative, etc.). Further, only the values output from the polyphase filters 401 and 409 are used whereas the values output from the polyphase filters 403 and 407 are not used, and the ultimate output values are all real. The values at the output of the REAL( ) block 213 have a predictable alternating sign change pattern, beginning with a positive value, followed by a pair of negative values, followed by a pair of positive values, and so on, resulting in a repeating sign change after every pair of values, or +−−++−−++−−++−−++ . . . .

Figure 5:
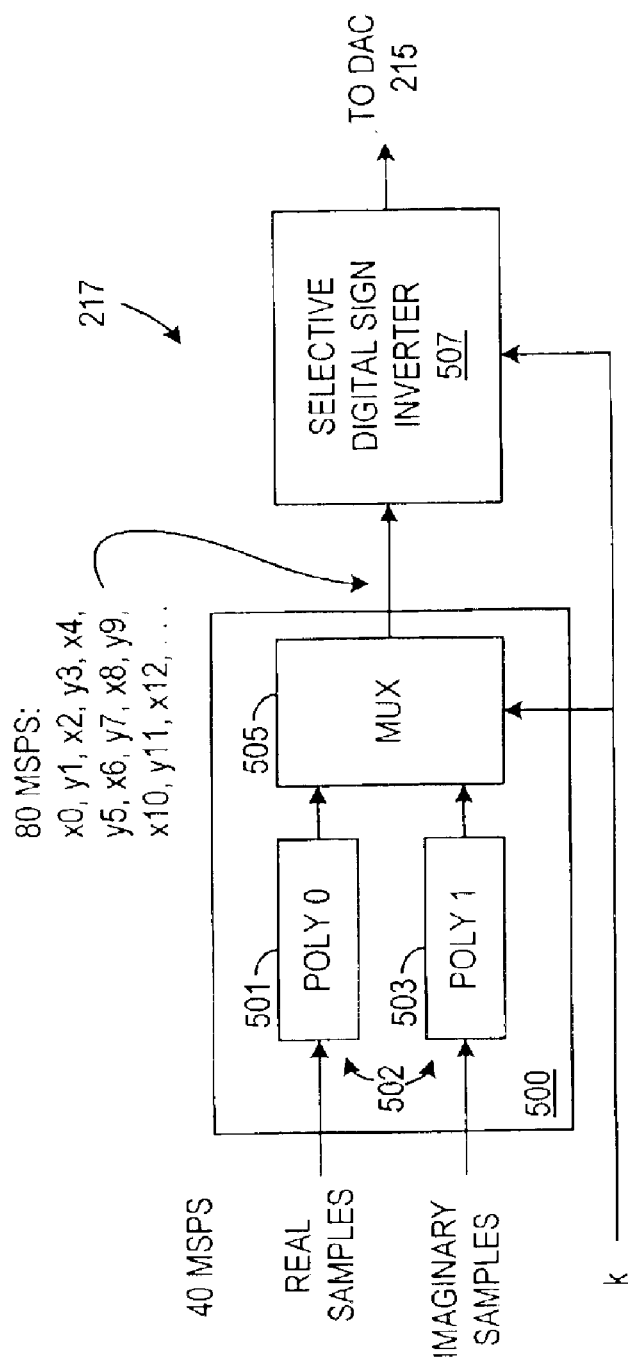
FIG. 5 is a block diagram illustrating an integrated modulator configuration of the circuit of FIG. 2 according to an exemplary embodiment of the present invention.

FIG. 5 is a block diagram illustrating an integrated modulator configuration of the circuit 217 according to an exemplary embodiment of the present invention. The interpolator 207 is implemented with a simplified interpolator 500, which includes a single MUX 505 and a single symmetric half-band FIR filter 502 implemented with a pair of polyphase filters 501 (POLY 0) and 503 (POLY 1). The real sample values are provided to the input of the polyphase filter 501 and the imaginary values are provided to the input of the polyphase filter 503. The MUX 505 first selects the output of the polyphase filter 501 and then alternates between selecting the respective outputs of the polyphase filters 501 and 503 at a rate of 80 Msps to output a stream of digital sample values x0, y1, x2, y3, x4, y5, x6, y7, x8, y9, x10, y11, x12, . . . . It is noted that the magnitudes of the values at the output of the MUX 505 are the same as the values at the output of the REAL( ) block 213.

The output stream from the MUX 505 is provided to a selective digital sign inverter 507, which performs the repeating sign change pattern based on the index value k, e.g., +−−++−−++−−++−−++ . . . . Since the inputs to the selective digital sign inverter 507 are positive, it passes the first value and negates the next pair of values and negates every other pair of values thereafter to achieve the desired output pattern x0, −y1, −x2, y3, x4, −y5, −x6, y7, x8, −y9, −x10, y11, x12, . . . . The selective digital sign inverter 507 may be implemented in any one of many different ways. In one embodiment, for example, a counter and selective digital sign inverter circuit (not shown) passes the first value and every other pair of values unmodified (e.g., k=0, 3, 4, 7, 8, 11, 12, . . . ) and sign-inverts or negates every other pair of values (e.g., k=1, 2, 5, 6, 9, 10, . . . ). The 2's complement operation is contemplated to perform digital negation. In another embodiment, each sample is digitally negated, such as using 2's complement or the like, and a MUX (not shown) selects the positive or negative digital value.

The symmetric half-band FIR filter 502 is implemented with the pair of polyphase filters 501 and 503, each including every other tap of the filter 502. The polyphase filter 501 includes symmetrical non-zero coefficient taps and the polyphase filter 503 includes zero coefficient taps and a unity center tap. In one specific embodiment, the symmetric half-band FIR filter 502 is implemented with 11 tap coefficients using 11-bit fixed-point format sx.xxxxxxxxx including a sign bit "s", a first unity bit "x" followed by 9 fractional bits. In the specific embodiment, the tap coefficients are: 0.017578125, 0, −0.115234375, 0, 0.59765625, 1.0 (center tap), 0.59765625, 0, −0.115234375, 0, and 0.017578125. The polyphase filter 501 includes the 6 taps with non-zero coefficients 0.017578125, −0.115234375, 0.59765625, 0.59765625, −0.115234375, and 0.017578125, and the polyphase filter 503 includes the 4 zero-coefficient taps and the center tap, or 0, 0, 1.0, 0, and 0.

A comparison of FIGS. 4 and 5 reveal a significant amount of simplification is achieved using the integrated version of the circuit 217 shown in FIG. 5. The second interpolator 207 is implemented with one symmetric half-band FIR filter 500 including a single pair of polyphase filters and a single MUX as compared to a pair of FIR filters and two multiplexers, resulting in only half the amount of circuitry and/or complexity. The complex multiplier 209, the Weaver modulator 211 and the REAL block 213 are all eliminated and replaced with the selective sign inversion circuit 507, which is significantly easier to design and implement. The resulting transfer function is the same.

FIG. 6 is a block diagram illustrating a functional transfer function of the RX processor 121 within the BBP 107. A received signal from the radio 105, after RF and analog processing, is provided to the ADC 601 for conversion to digital format. In the embodiment shown, the ADC 601 operates at approximately 80 MHz to provide digital samples at a rate of 80 Msps having an IF carrier frequency of 20 MHz. The digital samples are provided to one input of a digital mixer 603, which receives phase multiplier values at another input from a Weaver demodulator 605. The mixer 603 and the Weaver demodulator 605 collectively perform the Weaver demodulation process to remove IF. The Weaver demodulator 605 operates in a similar manner as the Weaver modulator 211 except applying opposite phase-shift multiplier values. E.g., the Weaver demodulator 605 provides phase-shift multipliers to the complex multiplier 603 in the form of $e^{-j\pi k/2}$, where the carrier frequency (fc) is 20 MHz, the sample rate (fs) is 80 MHz and k is the index value in a similar manner as previously described. In complex format for k=0, 1, 2, . . . , the phase-shift multipliers become a repeating sequence of 1+j0, 0−j1, −1+j0, and 0+j1, or 1, −j, −1, j, 1, −j, −1, j, . . . . As noted previously, multiplication of phase in the time domain is equivalent to shifting of the frequency in the frequency domain. The Weaver demodulator 605 delivers the repeating phase-shift values for corresponding samples and the complex multiplier 603 effectively modulates the 20 MHz IF signal down to a baseband signal thus performing demodulation.

The samples from the ADC 601 are real and the output of the mixer 603, which may be implemented as a complex multiplier, for example, would otherwise be complex samples with both real and imaginary values. In a similar manner as described above relative to modulation, the choice of frequency ratio of the sample rate and the IF results in a simplified discrete 90 degree phase-shift multiple rotation that alternates between unity real and imaginary multiples with a predicable sign-change pattern. In the demodulation case, the phase rotation is clockwise beginning at zero degrees resulting in the rotating phase values 1, −j, −1, j, 1, −j, −1, j, . . . , which alternate between real and imaginary unity values with every other pair of values after the first value being sign inverted or negated. Since the digital samples from the ADC 601 are real, the output values of the mixer 603 also alternate between real and imaginary with the same sign shift pattern. Since the phase shift values from the Weaver demodulator 605 each have unity magnitude, multiplication is not necessary so that demodulation is achieved by selected sign inversion or negation.

The digital sample stream from the mixer 603 is sequentially processed by a first decimator 607 and then by a second decimator 609, where each decimator 607, 609 reduces the number of samples by one-half (÷2). In this manner, the first decimator 607 receives samples at a rate of 80 Msps and provides samples at a rate of 40 Msps and the second decimator 609 receives the 40 Msps samples and provides samples at a rate of 20 Msps. The output of the second decimator 609 is provided to additional BBP processing circuitry 613, which performs various functions as known to those skilled in the art of wireless communications, which is beyond the scope of the present invention and will not be further described. The present disclosure partly concerns simplification in the form of integration of the Weaver demodulator 605, the mixer 603 and the first decimator 607, collectively shown as a circuit 611. The second decimator 609 may also be simplified as further described below.

Figure 7:
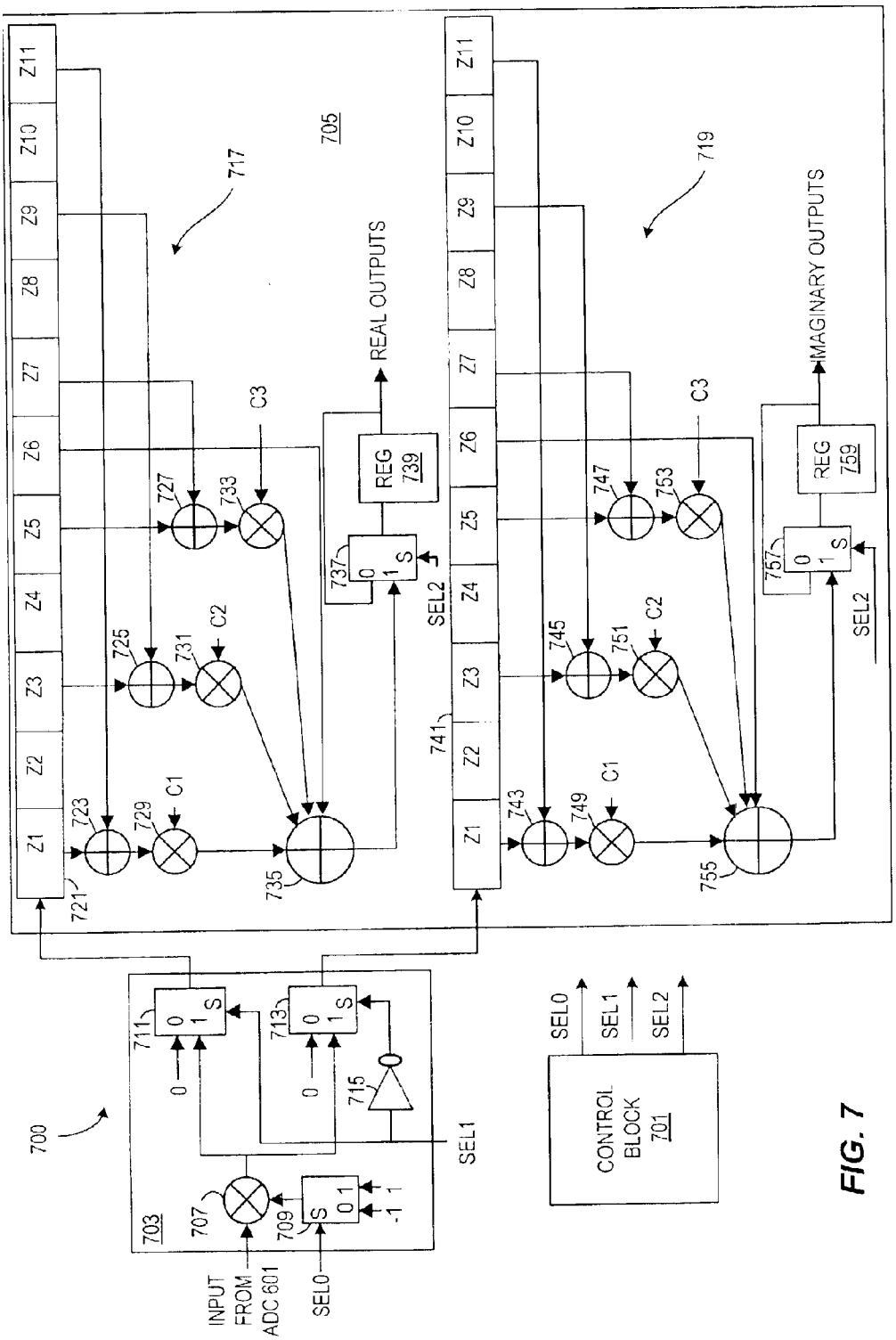
FIG. 7 is a simplified block diagram of a circuit that implements the circuit of FIG. 6, including a control block, a Weaver demodulation circuit, and a decimator.

FIG. 7 is a simplified block diagram of a circuit 700 that implements the circuit 611, where the circuit 700 includes a control block 701, a Weaver demodulation circuit 703, and a decimator 705. The control block 701 outputs several select signals SEL0, SEL1, and SEL2 provided to corresponding MUXs as further described below. In the embodiment shown, the select signals SEL0–SEL2 are each 1-bit select values asserted in accordance with predetermined timing based on the operating frequency (80 MHz) of the primary clock signal, in order to propagate the sample values through the RX processor 121 of the BB Processor 107. The Weaver demodulation circuit 703 includes a mixer 707, a MUX 709, a pair of output MUXs 711, 713 and an inverter 715. The mixer 707 has one input for receiving real sample values from the ADC 601 at a rate of 80 Msps and another input coupled to an output of the MUX 709. The SEL0 signal is provided to the select "S" input of the MUX 709 for selecting either a 1 or −1 provided to the "1" or "0" inputs, respectively, of the MUX 709. If a positive 1 is selected by MUX 709 via the SEL0 signal, then the sample from the ADC 601 is passed to the output of the mixer 707 unmodified. If a negative 1 is selected, then the sample value from the ADC 601 is sign-inverted or negated. In this manner, the MUX 709 and the mixer 707 collectively operate to selectively negate the digital sample values from the ADC 601 (e.g., function of a digital sign inverter). The 2's complement operation is contemplated to perform digital negation of the digital samples.

The output of the mixer 707 is provided to one input (e.g., "1" input) of each of the 2-input MUXs 711 and 713. The other input (e.g., "0" input) of each MUX 711 and 713 is a digital zero. The SEL1 signal is provided to the select input of the MUX 711 and to the input of an inverter 715. The output of the inverter 715 is provided to the select input of the MUX 713. In this manner, the output of the mixer 707 is selected by one of the MUXs 711 and 713 while the other MUX selects a zero value and vice-versa for each clock cycle as controlled by the control block 701 via the SEL1 signal.

The output of the MUX 711 is provided to a shift register 721 of a real portion 717 of the decimator 705 and the output of the MUX 713 is provided to a shift register 741 of an imaginary portion 719 of the decimator 705. Each shift register 721, 741 holds eleven sequential memory positions Z1, Z2, . . . , Z11 that are shifted one at a time from Z1 to Z11. Thus, each pair of sample values from the MUXs 711, 713 are shifted into the Z1 positions of the respective registers 721, 741, while the sample values in the respective positions Z1 are shifted into the next sequential respective positions Z2, and so on up to the last respective positions Z11.

Each of the real and imaginary portions 717, 719 of the decimator 705 is configured as a symmetric half-band FIR filter. For the real portion 717, an adder 723 adds samples at memory positions Z1 and Z11, an adder 725 adds samples at memory positions Z3 and Z9, and an adder 727 adds samples at memory positions Z5 and Z7 of the shift register 721. A multiplier 729 multiplies the output of adder 723 with a first coefficient C1, a multiplier 731 multiplies the output of adder 725 with a second coefficient C2, and a multiplier 733 multiplies the output of adder 727 with a third coefficient C3. An output adder 735 adds together the outputs of the multipliers 733, 731 and 729 with the sample value at center tap memory position Z6 of the register 721, and provides the sum to one input (e.g., "1" input) of a two-input MUX 737. The output of the MUX 737 is provided to the input of a register 739, which stores a real output value provided at its output. The real output is fed back to the second input (e.g., "0" input) of the MUX 737, which receives the SEL2 signal at its select input. It is noted that the feedback combination of a MUX (e.g., MUX 737) and a register (e.g., register 739) forms a "multiplexed register." In this manner, the control block 701 updates the real output value stored in the register 739 via the SEL2 signal by selecting the output of the adder 735, and holds the previous real output value by selecting the feedback output of the register 739.

The imaginary portion 719 is configured in substantially the same manner as the real portion 717. For the imaginary portion 719, an adder 743 adds samples at memory positions Z1 and Z11, an adder 745 adds samples at memory positions Z3 and Z9, and an adder 747 adds samples at memory positions Z5 and Z7 of the shift register 741. A multiplier 749 multiplies the output of adder 743 with the first coefficient C1, a multiplier 751 multiplies the output of adder 745 with the second coefficient C2, and a multiplier 753 multiplies the output of adder 747 with the third coefficient C3. It is noted that the coefficients C1, C2 and C3 are the same for the real and imaginary portions. An output adder 755 adds together the outputs of the multipliers 749, 751 and 753 with the sample value at center tap memory position Z6 of the register 741, and provides the sum to one input (e.g., "1" input) of a two-input MUX 757. The output of the MUX 757 is provided to the input of a register 759, which stores an imaginary output value provided at its output. The imaginary output is fed back to the second input (e.g., "0" input) of the MUX 757, which receives the SEL2 signal at its select input. In this manner, the control block 701 also updates the imaginary output value stored in the register 759 via the SEL2 signal by selecting the output of the adder 755, and to hold the previous imaginary output value by selecting the feedback output of the register 759.

In operation, the control block 701 asserts the SEL0 signal in accordance with the repeating sign pattern (e.g., +--++-- . . . ), so that the first digital sample from the Weaver demodulation circuit 703 is left unmodified, the next pair of samples are negated (e.g., 2's complemented), the next pair are left unchanged, and so on, so that every other pair are negated. The control block 701 toggles the SEL1 signal so that the MUX 711 selects the real values and the MUX 713 selects the imaginary values. For every real value selected by the MUX 711, the imaginary value is zero so that the MUX 713 selects a zero. Likewise, for every imaginary value selected by the MUX 713, the real value is zero so that the MUX 711 selects a zero. In this manner, while a real value is shifted into the Z1 memory position of the shift register 721, a zero value is shifted into the Z1 memory position of the shift register 741, and while an imaginary value is shifted into the Z1 memory position of the shift register 741, a zero value is shifted into the Z1 memory position of the shift register 721.

The memory positions Z1–Z11 of both of the shift registers 721 and 741 are initially cleared to zero values and the initial real and imaginary outputs are transient values until valid demodulated digital samples are shifted into the memory positions Z11 of both of the shift registers 721 or 741. For the shift register 721, the odd memory positions Z1, Z3, Z5, Z7, Z9 and Z11 also have valid demodulated real samples while the even memory positions Z2, Z4, Z6, Z8 and Z10 are filled with zeroes, which includes the center tap memory position Z6. The SEL2 signal is asserted to select the output of the adder 735 to store a filtered real digital value into the register 739. At the same time, the odd memory positions Z1, Z3, Z5, Z7, Z9 and Z11 of the shift register 741 are filled with zeroes while the even memory positions including the center tap memory position Z6 each hold a demodulated imaginary sample. When the SEL2 signal is asserted, the sample value in the memory position Z6 of the shift register 741 is stored into the register 759. For decimation, the SEL2 signal is negated during the next clock and shift cycle so that the values stored in the registers 739 and 759 are shifted back into these same registers via the MUXs 737, 757 and the real and imaginary sample sets in the shift registers 721 and 741, respectively, are ignored.

Operation is repeated for the next clock cycle, in which real sample values shifted into the center tap memory position Z6 and the odd memory positions Z1, Z3, . . . , Z11 of the shift register 721 are filtered and the SEL2 signal is asserted to store a new filtered real value in the register 739. It is noted that the even memory positions of the shift register 721 are zero, so that the center tap memory position Z6 of the register 721 does not contribute to the result. Meanwhile, only the demodulated imaginary sample shifted into the center tap memory position Z6 of the shift register 741 contributes to the new filtered imaginary value stored in the register 759. In this manner, the control block 701 controls the decimator 705 via the SEL2 signal to output filtered real and imaginary values at a rate of 40 Msps.

It has been observed that significant simplification by integration can be achieved. The architecture of the FIR filters in the real and imaginary portions 717, 719 are very similar with the same filter coefficients. The choice of frequency ratio of the sample rate and the IF results in alternating real and imaginary demodulated samples from the Weaver demodulation circuit 703, so that alternating zeroes are shifted into both shift registers 721, 741. The center tap memory position Z6 of the shift register 721 does not contribute to the real output values while at the same time, only the center tap memory position Z6 of the shift register 741 contributes to the imaginary output values.

Figure 8:
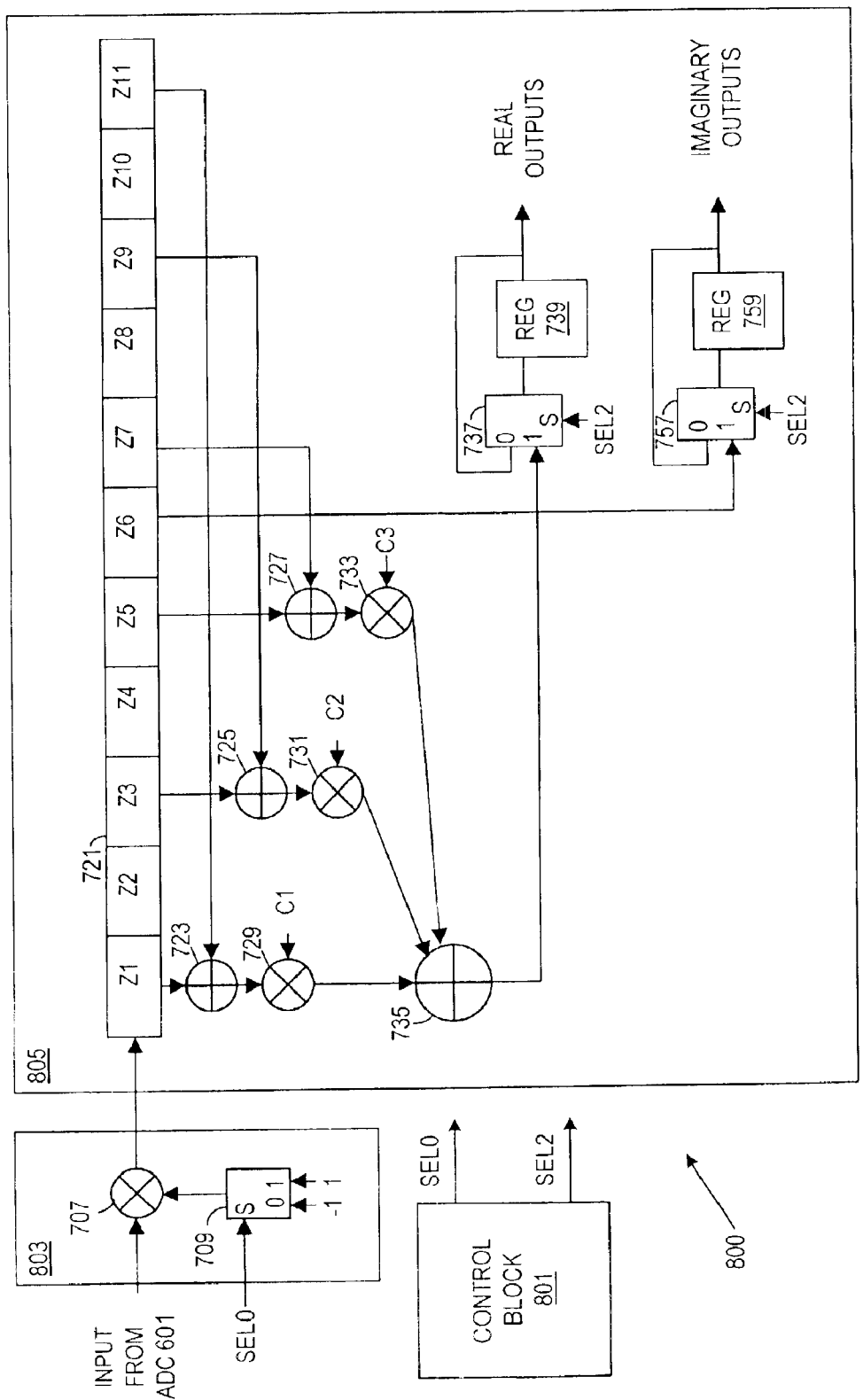
FIG. 8 is a block diagram of a circuit illustrating an integrated demodulator configuration of the circuit of FIG. 6 according to an exemplary embodiment of the present invention.

FIG. 8 is a block diagram of a circuit 800 illustrating an integrated demodulator configuration of the circuit 611 according to an exemplary embodiment of the present invention. The circuit 800 includes a control block 801, a Weaver demodulation circuit 803 and a decimator 805. The Weaver demodulation circuit 803 is a simplified version of the Weaver demodulation circuit 703 and only includes the mixer 707 and the MUX 709, which operate in substantially the same manner. The MUXs 711 and 713 and the inverter 715 are eliminated and the alternating demodulated real and imaginary digital samples at the output of the mixer 707 are all provided to the input of the shift register 721 of the decimator 805. The control block 801 develops the SEL0 signal in the same manner as the control block 701 and the SEL1 signal is eliminated. The decimator 805 includes the real portion 717 of the decimator 705 in substantially the same configuration except that the value in the memory position Z6 is not provided to the adder 735. The imaginary portion 719 of the decimator 705 is almost entirely eliminated except for the MUX 757 and register 759. The value from the memory position Z6 is provided to one input (e.g., the "1" input) of the MNX 757 for the decimator 805. The control block 801 develops the SEL2 signal in the same manner, and the SEL2 signal is provided to the select inputs of the MUXs 737 and 757 in the same manner as for the decimator 705. It is appreciated that the amount of circuitry is reduced by almost half.

Figure 9:
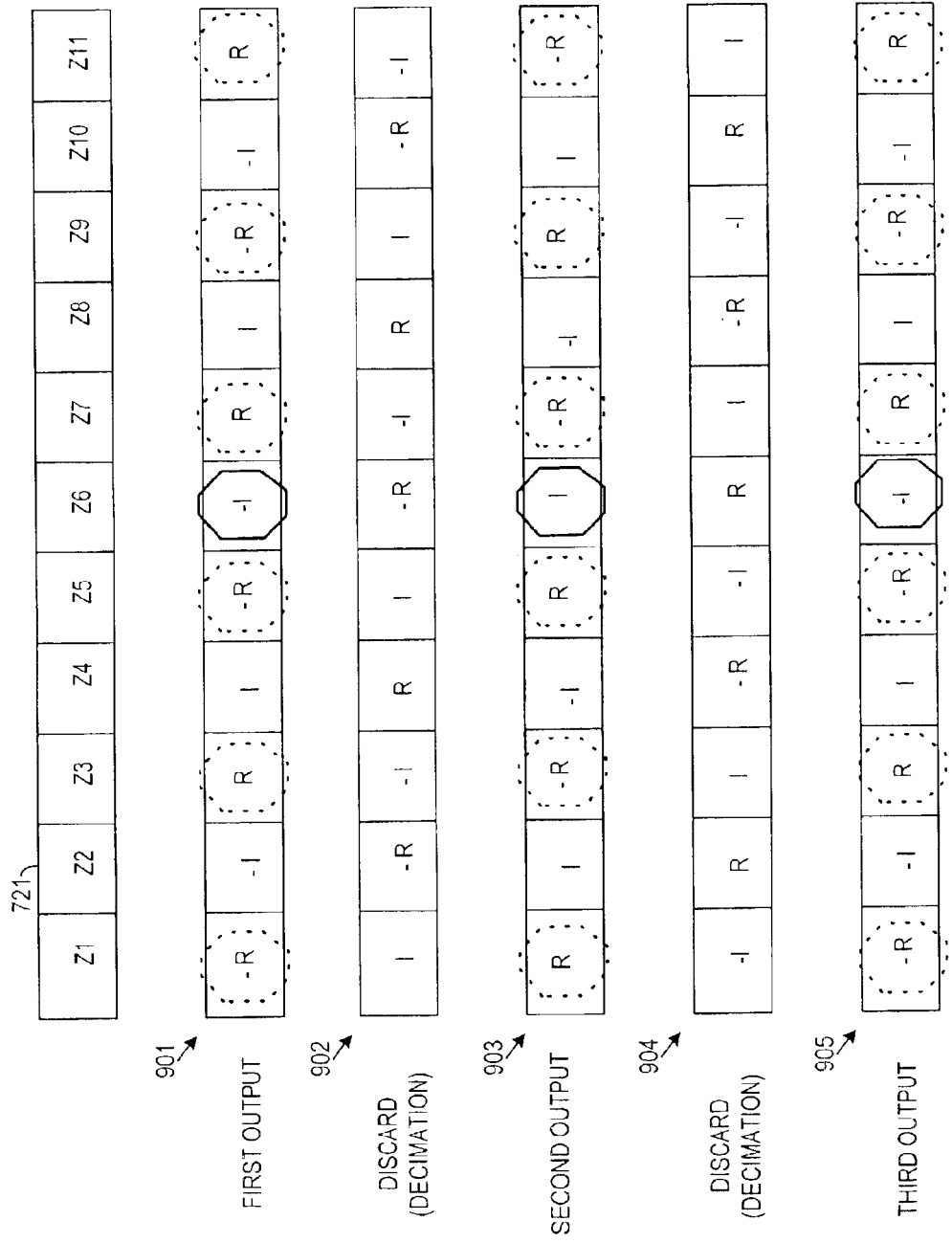
FIG. 9 is a figurative block diagram illustrating operation of the decimator of FIG. 8 employing the shift register of FIG. 7.

FIG. 9 is a figurative block diagram illustrating operation of the decimator 805 employing the shift register 721. The shift register 721 is shown at the top of the diagram and corresponding contents within each of the memory positions Z1–Z11 are shown after each clock shift in consecutive rows 901, 902, 903, 904 and 905. The contents at each memory position is represented using the letter "R" for real values and "I" for imaginary values and values that have been negated by the Weaver demodulation circuit 803 include a minus "−" sign. Values surrounded by a dotted-line octagon represent real values that are added with corresponding symmetrical values and then multiplied by corresponding coefficients (C1–C3) as previously described for providing real output values. Values surrounded by a solid-line octagon represent an imaginary value shifted into the center tap memory position Z6 which are used as the imaginary output values.

The state of the register 721 for the first complex output is shown at row 901 in which the first real sample has been shifted all the way to the Z11 memory position, followed by a negative imaginary value "−I" at position Z10 and so on with a negative real value "−R" at memory position Z1. The real values at memory positions Z1, Z3, Z5, Z7, Z9 and Z11 are processed to provide a real output value and the negative imaginary value at center tap memory position Z6 is used as the imaginary output value to provide the first complex output. A shift occurs resulting in the next consecutive shifted state as shown in row 902 in which all values are shifted from Z1 to Z11 one position and a positive imaginary value "I" is shifted into memory position Z1. The state of the register 721 shown at row 902 is not used so that any corresponding output is discarded in order to implement the decimation function. Another shift occurs resulting in the next consecutive shifted state as shown in row 903 in which all values are again shifted from Z1 to Z11 one position and a positive real value "R" is shifted into memory position Z1. The state of the register 721 shown at row 903 is used in a similar manner as row 901 to generate a second complex output. Another shift occurs resulting in the next consecutive shifted state as shown in row 904 in which a negative imaginary value "−I" is shifted into memory position Z1. This state of the register 721 shown at row 904 is again not used because of decimation. Another shift occurs resulting in the next consecutive shifted state as shown in row 905 in which a negative real value "−R" is shifted into memory position Z1. This state of the register 721 shown at row 905 is used to generate a third complex output value. Operation proceeds in this manner until the entire received input signal is processed.

The circuit 800 performs the same transfer function as the circuit 700 for implementing the circuit 611 to perform Weaver demodulation and decimation by 2. The alternating real and imaginary demodulated values from the Weaver demodulation circuit 803 are sequentially shifted into the register 721 at the 80 Msps rate. Real values shifted into the odd memory positions Z1, Z3, . . . , Z11 every other clock cycle are filtered to provide a real output value in the register 739. Imaginary values shifted into the center tap memory position Z6 every other clock cycle are provided to and stored in the register 759 providing imaginary output values coincident with the real output values. The integrated implementation of circuit 800 provides substantial simplification in that complex addition and/or multiplication is avoided and at least one shift register and a significant number of adders and multipliers are eliminated. In this manner, a substantial amount of silicon area is saved within a baseband processor integrated circuit.

In a specific embodiment, the decimator 805 is implemented as a symmetric half-band FIR filter in which C1=0.017578125, C2=0.115234375, C3=0.59765625, and the center tap is unity. The remaining taps are 0.

Figure 10:
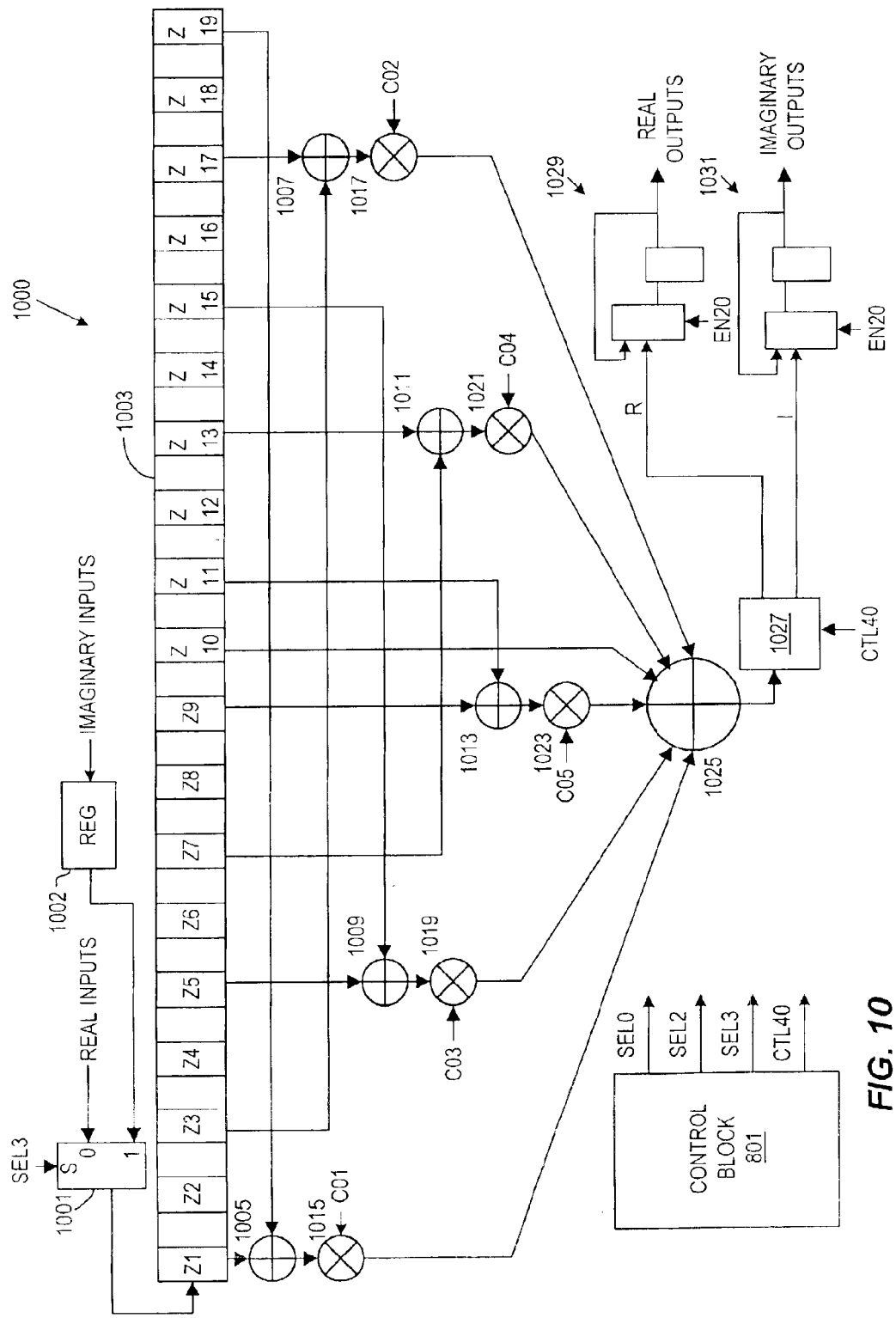
FIG. 10 is a block diagram of an exemplary circuit used to implement the second decimator of FIG. 6.

FIG. 10 is a block diagram of an exemplary circuit 1000 used to implement the second decimator 609. The control block 801 is shown including an additional select signal SEL3 and one or more control signals CTL40, described further below. A MUX 1001 has one input coupled to the output of the register 739 for receiving the real output values, another input coupled to the output of a register 1002 that receives the imaginary output values from the decimator 805, and a select input for receiving the SEL3 signal. The register 1002 delays the imaginary data by the operative rate (e.g. 80 MHz). The MUX 1001 selects the real or delayed imaginary values via the SEL3 signal, which is alternated every other operative rate cycle by the control block 801 to serialize the complex data from the decimator 805. The alternating real and imaginary values from the MUX 1001 are provided to a shift register 1003 having a total of 37 sequential memory positions. Every odd memory position is labeled with a corresponding consecutive Z number, Z1, Z2, Z3, . . . , Z19, and the even memory positions are temporary shift storage positions that are not labeled. Every other one of the odd memory positions Z1–Z19, i.e., Z1, Z3, Z5, . . . , Z19 are used to calculate filtered values and the remaining even memory positions Z2, Z4, Z6, . . . , Z18 and the intermediate even memory positions are used to temporarily store sequentially shifted values from Z1 to Z19.

The register 1003 is used to implement a symmetric half-band FIR filter receiving complex values at an effective rate of 40 Msps. It is noted that individual real and imaginary values are sequentially shifted through the memory positions of the shift register 1003 at 80 Msps, which is equivalent to 40 complex Msps. An adder 1005 adds values in memory positions Z1 and Z19 together, an adder 1007 adds values in memory positions Z3 and Z17 together, an adder 1009 adds values in memory positions Z5 and Z15 together, an adder 1011 adds values in memory positions Z7 and Z13 together, and an adder 1013 adds values in memory positions Z9 and Z11 together. A multiplier 1015 multiplies the sum output of adder 1005 with a first coefficient C01, a multiplier 1017 multiplies the sum output of adder 1007 with a second coefficient C02, a multiplier 1019 multiplies the sum output of adder 1009 with a third coefficient C03, a multiplier 1021 multiplies the sum output of adder 1011 with a fourth coefficient C04, and a multiplier 1023 multiplies the sum output of adder 1013 with a fifth coefficient C05. An output adder 1025 adds the outputs of the multipliers 1015–1023 together and provides the sum to an input of store and select logic 1027. The store and select logic 1027 receives the CTL40 signal from the control block 801, and provides real output values on signal lines R to a first multiplexed register 1029 and imaginary output values on signal lines I to a second multiplexed register 1031, each at a rate of 40 Msps. The multiplexed registers 1029 and 1031 receive a 20 MHz enable signal EN20 and output decimated complex values at a rate of 20 Msps.

In a more specific embodiment, the coefficients for the circuit 1000 are C01=0.00725138232653, C01=0.02452066412305, C03=0.06875493541570, C04=0.17196823509853, and C05=0.62228691321826. In an alternative embodiment using binary 12-bit quantization values having format "sx.xxxxxxxxxx", the coefficients are C01=0.0068359375, C02=0.0244140625, C03=0.068359375, C04=0.171875, and C05=0.6220703125.

In operation, a first set of alternating real and imaginary values are shifted in to fill the shift register 1003 so that the odd memory positions Z1–Z19 are filled with valid real values and the even memory positions are filled with imaginary values. The store and select logic 1027 stores a real value. After the shift register 1003 is shifted again, the odd memory positions Z1–Z19 are filled with imaginary values and the even memory positions are filled with real values, and the store and select logic 1027 receives and stores a corresponding imaginary value. Although not shown, the store and select logic 1027 includes a storage register and a pair of multiplexed registers. The real and imaginary output values are shifted out onto the R and I signal lines, respectively, to the multiplexed registers 1029 and 1031, respectively at a rate of 40 Msps. The multiplexed registers 1029 and 1031 store and forward every other set of decimated complex values (e.g., R1/I1, R3/I3, R5/I5, . . . ) and discard every other set of decimated complex values (e.g., R2/I2, R4/I4, R6/I6, . . . ) to provide decimated complex values at a rate of 20 Msps.

In a specific embodiment employing the integrated demodulation and decimation filters in the RX processor 121, a savings of more than 40% area compared to a nonintegrated version was achieved. The total number of gates, nets and cells was each reduced by approximately 44%. The combinational area was reduced by approximately is 46%, the non-combinational area was reduced by approximately 41% and the total cell area was reduced by approximately 44%. This is based only on the integration of the Weaver demodulator and first decimator in which an extra shift register, complex additions, and partial complex multiplications are eliminated. The reduction in component count and silicon area results in reduced implementation costs and reduced power consumption during operation. The embodiments illustrated employed filters with symmetric taps that are real rather than being complex. The integrated approach results in significant savings even if non-symmetric complex taps are employed, resulting in a somewhat larger overall area as compared to the symmetric real tap configurations.

Although a system and method according to the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention.

What is claimed is:

1. An integrated demodulator and decimator circuit for processing digital samples of a received signal having a predetermined intermediate frequency (IF) and sampled at a sample rate based on a clock having a frequency that is four times the IF, said integrated demodulator and decimator circuit comprising:

a digital sign inverter that sign inverts selected digital samples according to a predetermined phase-shift pattern and that outputs demodulated digital samples at said sample rate; and a decimator, comprising a symmetric half-band FIR filter with a plurality of taps including alternate zero and non-zero taps and a center tap, wherein said demodulated digital samples are sequentially shifted through said plurality of taps at said sample rate, and wherein said decimator outputs complex digital values at half said sample rate including real output values based on demodulated digital samples shifted into alternate taps and corresponding imaginary output values based on demodulated digital samples shifted into said center tap.

2. The integrated demodulator and decimator circuit of claim 1, wherein said decimator comprises:

a shift register that sequentially shifts said demodulated digital samples through a plurality of sequential memory positions at said sample rate;

a symmetric half-band FIR filter circuit coupled to alternate memory positions of said shift register corresponding to non-zero taps; and a select circuit, coupled to said shift register and said filter circuit, that outputs said real output values generated by said filter circuit and imaginary output values based on selected demodulated digital samples shifted into a memory position corresponding to said center tap.

3. The integrated demodulator and decimator circuit of claim 2, wherein said select circuit performs decimation by two by discarding output value sets associated with every other sequential shift through said shift register.

4. The integrated demodulator and decimator circuit of claim 2, wherein said filter circuit comprises:

a plurality of adders coupled to said alternate memory positions corresponding to non-zero taps, each adder adding a pair of symmetrical tap memory positions on either side of said center tap;

a plurality of multipliers, each multiplier for multiplying an output of a corresponding adder with a corresponding one of a plurality of predetermined coefficients; and an output adder that adds the outputs of the plurality of multipliers for determining said real output values.

5. The integrated demodulator and decimator circuit of claim 1, further comprising a second symmetric half-band FIR filter decimator that receives and decimates by two said complex digital values.

6. The integrated demodulator and decimator circuit of claim 1, wherein said digital sign inverter negates selected digital samples base on Weaver demodulation.

7. The integrated demodulator and decimator circuit of claim 6, wherein said digital sign inverter performs a 2's complement operation on every other pair of digital samples.

8. The integrated demodulator and decimator circuit of claim 1, wherein the received signal is based on orthogonal frequency division multiplexing (OFDM) having an IF of approximately 20 megahertz (MHz) and wherein the sample rate is approximately 80 mega samples per second (Msps).

9. An integrated modulator and interpolator circuit for modulating a carrier signal having a predetermined intermediate frequency (IF) with a baseband signal sampled at a sample rate having approximately the same frequency as the IF and interpolated into complex digital samples at twice the sample rate, said integrated modulator and interpolator circuit comprising:

a FIR filter interpolator having a plurality of taps, comprising:
      a first polyphase filter including alternate taps of said plurality of taps for receiving and filtering real digital samples of the complex digital sample at the first sample rate;
      a second polyphase filter including remaining taps of said plurality of taps for receiving and filtering imaginary digital samples of the complex digital samples at the sample rate; and
      a multiplexer coupled to outputs of said first and second polyphase filters for providing interpolated digital samples at four times the sample rate; and a digital sign inverter that negates selected digital samples of said interpolated digital samples according to a predetermined phase-shift pattern and that outputs modulated digital samples of a modulated signal at the IF.

10. The integrated modulator and interpolator circuit of claim 9, wherein said interpolator comprises a symmetric half-band FIR filter.

11. The integrated modulator and interpolator circuit of claim 10, wherein said first polyphase filter comprises taps with predetermined non-zero coefficients and wherein said second polyphase filter includes a unity center tap and a plurality of zero coefficient taps.

12. The integrated modulator and interpolator circuit of claim 9, wherein said digital sign inverter negates every other pair of digital samples in accordance with Weaver modulation.

13. The integrated modulator and interpolator circuit of claim 9, wherein the IF is 20 MHz and wherein the sample rate is 20 mega samples per second (Msps).

14. A method of demodulating an analog signal having a predetermined intermediate frequency (IF), comprising:
 sampling the analog signal based on a sample clock with a frequency of approximately four times the IF to provide digital samples;
 negated selected ones of said digital samples according to a predetermined phase-shift pattern to provide demodulated digital samples;
 shifting said demodulated digital samples through sequential taps of symmetric half-band FIR filter at a sample rate based on the sample clock, the FIR filter having symmetric alternate zero and non-zero taps on either side of a center tap;
 providing, from the FIR filter, imaginary values based on every other digital sample shifted into said center tap;
 providing, from the FIR filter, real values by applying predetermined filter coefficients to every other set of digital samples shifted into said non-zero taps; and
 decimating by two real and imaginary values output from said FIR filter.

15. The method of claim 14, wherein said sample clock is 80 megahertz (MHz).

16. The method of claim 14, wherein said negating comprises sign inverting every other pair of digital samples according to a sign changing pattern based on Weaver demodulation.

17. The method of claim 16, wherein:
 said shifting said demodulated digital samples comprises shifting samples into consecutive memory locations of a shift register; and
 wherein said providing real values comprises:
  adding symmetric pairs of demodulated digital samples shifted into said non-zero taps to provide a plurality of sum values;
  multiplying each sum value by a corresponding one of a plurality of predetermined filter coefficients to provide a plurality of filtered values; and
  adding said filtered values together.

18. A method of modulating a carrier signal having a predetermined intermediate frequency (IF) with a digital baseband signal, comprising:
 receiving complex digital samples at a predetermined sample rate and providing interpolated complex digital samples at twice said sample rate;
 applying real samples of said interpolated complex digital samples to a first polyphase filter including non-zero taps of a plurality of taps of a symmetric half-band FIR filter;
 applying imaginary samples of said interpolated complex digital samples to a second polyphase filter including remaining zero taps and a center tap of the plurality of taps of the FIR filter;
 selecting digital values at outputs of said first and second polyphase filters to provide interpolated digital values at four times said sample rate; and
 sign inverting selected ones of said interpolated digital values according to a predetermined phase-shift pattern to provide modulated digital values at four times said sample rate and modulated at the predetermined IF.

19. The method of claim 18, wherein said receiving a complex digital data stream comprises receiving OFDM samples at a rate of approximately 20 mega samples per second (Msps).

20. The method of claim 18, wherein said symmetric half-band FIR filter has a unity center tap and alternating zero and non-zero coefficient taps in which the center tap and zero coefficient taps are provided within the second polyphase filter.

21. The method of claim 18, wherein said sign inverting comprises digitally negating every other pair of selected digital values in accordance with a Weaver demodulation phase-shift pattern.

22. A baseband processor for a radio frequency (RF) transceiver, the baseband processor comprising:
 a transmit processor including an integrated modulator and interpolator, comprising:
  a transmit packet kernel that converts raw data into a complex digital sample stream at a predetermined sample rate, said complex digital sample stream including real and imaginary digital samples;
  an interpolator that converts said complex digital sample stream into an interpolated complex data stream at twice said sample rate;
  a first symmetric half-band FIR filter having a plurality of taps comprising a first polyphase filter including every other tap of said plurality of taps for receiving and filtering real digital samples of said interpolated complex sample stream and a second polyphase filter with remaining taps of said plurality of taps for receiving and filtering imaginary digital samples of said interpolated complex sample stream;
  a multiplexer coupled to outputs of said first and second polyphase filters for providing an interpolated digital sample stream at four times said sample rate;
  a first digital sign inverter that negates selected samples of said interpolated digital sample stream according to a predetermined phase-shift pattern and that outputs a modulated digital sample stream at a predetermined intermediate frequency (IF); and
  a digital to analog converter (DAC) that converts said modulated digital sample stream into an analog signal; and
 a receive processor including an integrated demodulator and decimator, said comprising:
  an analog to digital converter (ADC) that samples a received IF signal at four times said sample rate and that outputs a digital sample stream;
  a second digital sign inverter that receives said digital sample stream from said ADC, that negates selected digital samples according to a predetermined phase-shift pattern and that outputs a demodulated digital sample stream;
  a second symmetric half-band FIR filter with a plurality of taps including a center tap that receives said demodulated digital sample stream and outputs a stream of complex digital values at half said sample rate, said stream of complex digital values including real output values based on digital samples shifted into alternate non-zero taps on either side of said center tap and corresponding imaginary output values based on digital samples shifted into said center tap; and a second decimator that receives and decimates by two said stream of complex digital values from said first decimator.

23. The baseband processor of claim 22, wherein said transmit packet kernel converts data according to orthogonal frequency division multiplexing (OFDM).

24. The baseband processor of claim 22, wherein said IF is 20 MHz and wherein said predetermined sample rate is 80 Msps.

25. The baseband processor of claim 22, wherein said first and second digital sign inverters negate selected digital samples based on Weaver demodulation and Weaver modulation, respectively.

* * * * *